(12) United States Patent
Bang et al.

(10) Patent No.: US 10,916,701 B2
(45) Date of Patent: Feb. 9, 2021

(54) ULTRA-FINE PATTERN DEPOSITION APPARATUS, ULTRA-FINE PATTERN DEPOSITION METHOD USING THE SAME, AND LIGHT-EMITTING DISPLAY DEVICE MANUFACTURED BY ULTRA-FINE PATTERN DEPOSITION METHOD

(71) Applicant: LG DISPLAY CO., LTD., Seoul (KR)

(72) Inventors: Hyungseok Bang, Paju-si (KR); Hansun Park, Paju-si (KR); Hyeongjun Lim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/171,105

(22) Filed: Oct. 25, 2018

(65) Prior Publication Data

US 2019/0131527 A1 May 2, 2019

(30) Foreign Application Priority Data

Oct. 31, 2017 (KR) ........................ 10-2017-0144257

(51) Int. Cl.
*H01L 51/00* (2006.01)
*C23C 14/56* (2006.01)
(Continued)

(52) U.S. Cl.
CPC ........ *H01L 51/0009* (2013.01); *C23C 14/048* (2013.01); *C23C 14/12* (2013.01);
(Continued)

(58) Field of Classification Search
CPC ........... H01L 27/3244; H01L 2227/323; H01L 51/56; H01L 51/5012; H01L 51/5016;
(Continued)

(56) References Cited

U.S. PATENT DOCUMENTS

| 2006/0084006 A1 | 4/2006 | Kang et al. |
| 2007/0045540 A1 | 3/2007 | Kang et al. |
| 2008/0314881 A1 | 12/2008 | Ringeisen et al. |
| 2009/0325451 A1 | 12/2009 | Higo et al. |
| 2010/0015424 A1* | 1/2010 | Seo .......................... H01L 51/56 428/216 |
| 2012/0231228 A1 | 9/2012 | Fujimori et al. |

(Continued)

FOREIGN PATENT DOCUMENTS

| CN | 101471423 A | 7/2009 |
| JP | 2000-133443 A | 5/2000 |

(Continued)

*Primary Examiner* — Jesse Y Miyoshi
(74) *Attorney, Agent, or Firm* — Birch, Stewart, Kolasch & Birch, LLP

(57) ABSTRACT

An ultra-fine pattern deposition apparatus can include a base substrate; a photothermal converter disposed on or in the base substrate and configured to convert optical energy into thermal energy; a source part disposed on the photothermal converter; and a light reflector configured to reflect light based on a refractive index difference between the light reflector and the base substrate, and guide a source material emitted from the source part to a target region based on an opening in the light reflector and the photothermal converter being heated with the thermal energy from the photothermal converter, in which the opening in the light reflector includes a laterally recessed lower part and an upper part protruded from the laterally recessed lower part, and the laterally recessed lower part is between the upper part and the base substrate, and the photothermal converter is disposed between base substrate and the source part.

9 Claims, 12 Drawing Sheets

(51) Int. Cl.
  *C23C 14/04* (2006.01)
  *C23C 14/28* (2006.01)
  *H01L 51/56* (2006.01)
  *H01L 27/32* (2006.01)
  *C23C 14/12* (2006.01)

(52) U.S. Cl.
  CPC ............ *C23C 14/28* (2013.01); *C23C 14/562* (2013.01); *H01L 51/0011* (2013.01); *H01L 51/0013* (2013.01); *H01L 51/56* (2013.01); *H01L 27/3211* (2013.01); *H01L 27/3244* (2013.01)

(58) Field of Classification Search
  CPC ............... H01L 51/502; H01L 51/5024; H01L 51/5028; H01L 51/5032; H01L 51/5036; H01L 51/504; H01L 51/5044; H01L 51/0008; H01L 51/0009; H01L 51/0011; H01L 51/0013; B41M 5/382; B41M 5/38207; B41M 5/38214; B41M 5/38221
  See application file for complete search history.

(56) References Cited

U.S. PATENT DOCUMENTS

2014/0295587 A1  10/2014  Lee et al.
2019/0055640 A1* 2/2019  Sakio .................... C23C 14/04

FOREIGN PATENT DOCUMENTS

| KR | 10-2005-0082952 A | 8/2005 |
| KR | 10-2006-0034575 A | 4/2006 |
| KR | 10-2006-0036006 A | 4/2006 |
| KR | 10-2007-0024822 A | 3/2007 |
| KR | 10-2012-0113747 A | 10/2012 |
| KR | 10-2014-0004916 A | 1/2014 |
| KR | 10-2014-0102518 A | 8/2014 |
| KR | 10-2014-0114608 A | 9/2014 |
| KR | 10-2016-0030002 A | 3/2016 |
| TW | 201347258 | 11/2013 |
| TW | 201432976 A | 8/2014 |
| TW | 201614012 A | 4/2016 |
| WO | WO 2011/001596 A1 | 1/2011 |
| WO | 10-2017-0049767 A | 5/2017 |

* cited by examiner

Fig. 6
(a) 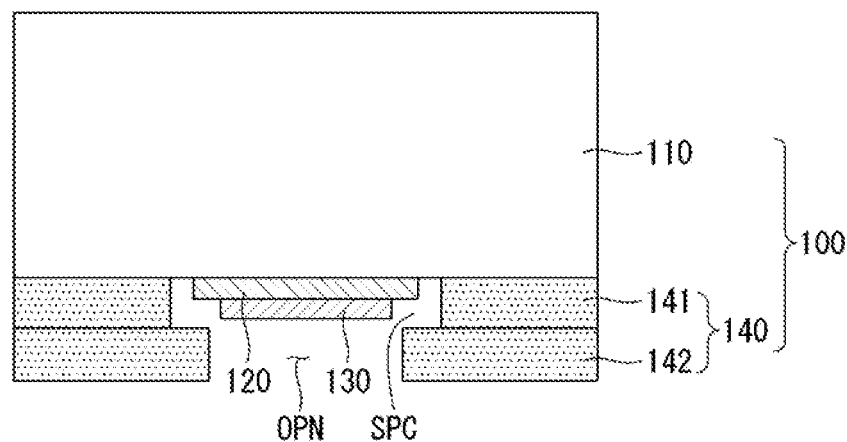
(b) 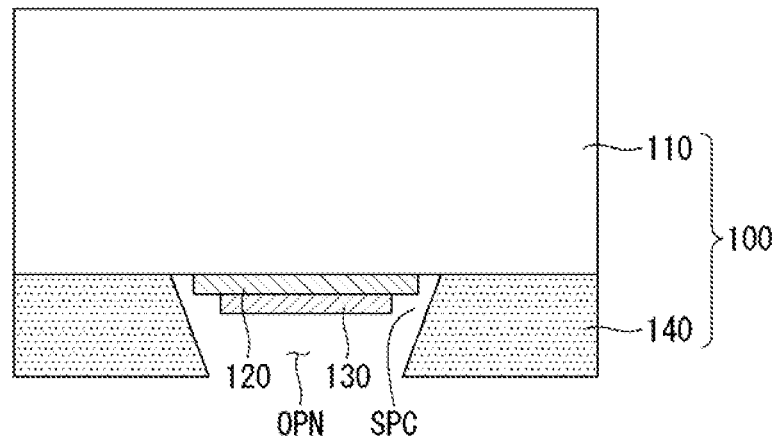

ULTRA-FINE PATTERN DEPOSITION APPARATUS, ULTRA-FINE PATTERN DEPOSITION METHOD USING THE SAME, AND LIGHT-EMITTING DISPLAY DEVICE MANUFACTURED BY ULTRA-FINE PATTERN DEPOSITION METHOD

CROSS-REFERENCE TO RELATED APPLICATIONS

This application claims the benefit of Korean Patent Application No. 10-2017-0144257, filed in the Republic of Korea on Oct. 31, 2017, which is incorporated herein by reference for all purposes as if fully set forth herein.

BACKGROUND OF THE INVENTION

Field of the Invention

The present invention relates to an ultra-fine pattern deposition apparatus, an ultra-fine pattern deposition method using the same, and a light-emitting display device manufactured by the ultra-fine pattern deposition method.

Related Art

With the development of information technology, markets for display devices which are connection media between users and information are growing. Accordingly, various types of display devices such as organic light-emitting displays, liquid crystal displays, electrophoretic displays and quantum dot displays are increasingly used.

Display devices as described above include a display panel, a driver which drives the display panel and a controller which controls the driver. There are various types of display panels used for display devices. However, display devices are similar in that a substrate and a structure formed as a thin film on the substrate are needed to form the display panel.

A structure in the form of a thin film is formed by a pattern transfer apparatus using a laser or the like. Conventionally, (1) a laser-induced thermal imaging (LITI) patterning method, (2) a laser-induced patternwise sublimation (LIPS) patterning method, and the like have been proposed. The LITI patterning method and the LIPS patterning method pattern an organic layer through shadow masking using fine holes formed in a metal thin film.

However, in the conventional LITI patterning method, issues with respect to the generation of particles arise and it is difficult to obtain clean edges when delamination is performed. In addition, when particles exist, a pattern is not formed. In the conventional LIPS patterning method, contact between a pattern source and a back plane is required during pattern transfer, which is cumbersome. Therefore, in order to form an ultra-fine (ultra-fine pitch) pattern to increase the area of a display panel, a deposition apparatus different from the conventional apparatuses is desired.

SUMMARY OF THE INVENTION

In an aspect, the present invention provides an ultra-fine pattern deposition apparatus including a base substrate, a photothermal converter, a source part and a light reflector. The photothermal converter is included in the base substrate and converts optical energy into thermal energy. The source part is disposed on the photothermal converter. The light reflector includes an opening having a laterally recessed lower part and an upper part protruded from the lower part to reflect external light input thereto based on a refractive index difference between the light reflector and the base substrate and to guide a source emitted from the source part to a target region.

In another aspect, the present invention provides an ultra-fine pattern deposition method using an ultra-fine pattern deposition apparatus including a photothermal converter included in a base substrate and converting optical energy into thermal energy, a source part disposed on the photothermal converter, and a light reflector including an opening having a laterally recessed lower part and an upper part protruded from the lower part to reflect external light input thereto based on a refractive index difference between the light reflector and the base substrate and to guide a source emitted from the source part to a target region. The ultra-fine pattern deposition method includes: arranging and aligning the ultra-fine pattern deposition apparatus and a target substrate; and radiating laser beams to the base substrate to deposit a pattern such that the source is deposited on emission regions of sub-pixels of the target substrate.

In another aspect, the present invention provides a light-emitting diode display device manufactured through the ultra-fine pattern deposition method.

BRIEF DESCRIPTION OF THE DRAWINGS

The accompany drawings, which are included to provide a further understanding of the invention and are incorporated in and constitute a part of this specification illustrate embodiments of the invention and together with the description serve to explain the principles of the invention.

FIG. 6, including (a) and (b), illustrates structures of a light reflector according to embodiments of the present invention.

DETAILED DESCRIPTION OF THE EMBODIMENTS

Reference will now be made in detail to embodiments of the invention and examples of which are illustrated in the accompanying drawings.

Hereinafter, specific embodiments of the present invention will be described with reference to the attached drawings.

An ultra-fine (ultra-fine pitch) pattern deposition apparatus which will be described below can be used to manufacture a display panel of a display device for use in TV, video players, personal computers (PCs), home theaters, smartphones, virtual reality (VR) devices, etc.

The aforementioned display devices may be organic light-emitting displays, liquid crystal displays, electrophoretic displays and quantum dot displays. Display devices include a display panel, a driver which drives the display panel and a controller which controls the driver. There are various types of display panels used for display devices.

However, display devices are similar in that a substrate and a structure formed as a thin film on the substrate are used to form the display panel. Accordingly, any display device which uses a method of depositing a thin film, particularly, an organic thin film (organic layer) on a substrate can be manufactured through the ultra-fine pattern deposition apparatus described in the present invention and the present invention is not limited to the aforementioned display devices.

In addition, organic thin films may include a hole transport layer (HTL), a hole injection layer (HIL), an emitting layer (EML), an electron transport layer (ETL), an electron injection layer (EIL), a capping layer (CPL), a charge generated layer (CGL), an electron blocking layer (EBL), an efficiency enhanced layer (EEL), an RGB prime layer, etc.

First Embodiment

Figure 1:
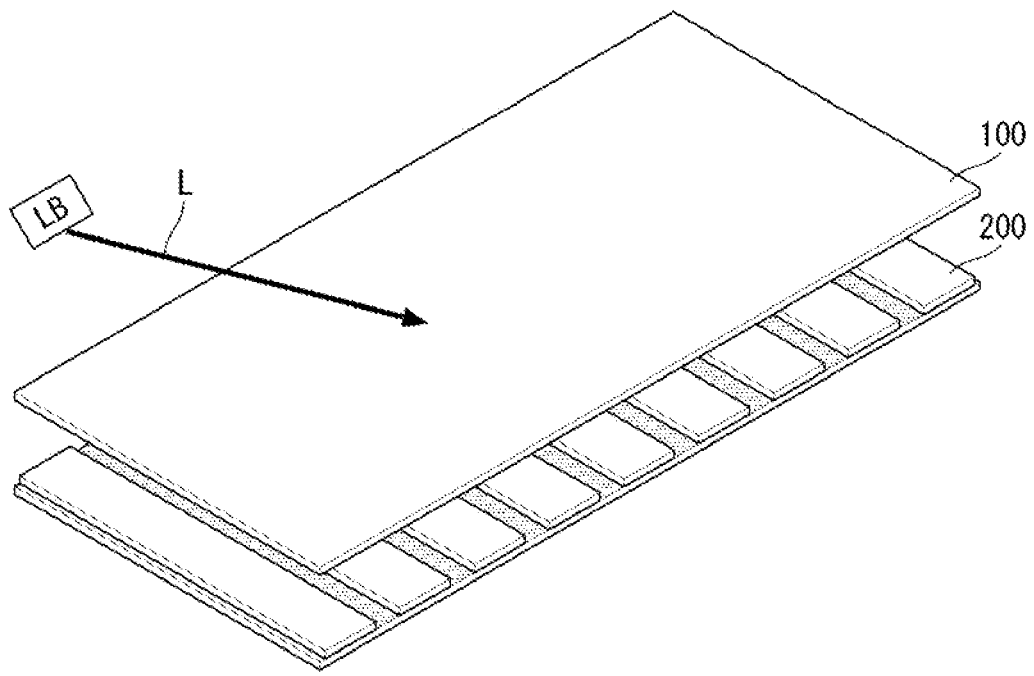
FIG. 1 is a perspective view for schematically illustrating a pattern deposition method using an ultra-fine pattern deposition apparatus according to a first embodiment of the present invention.
Figure 2:
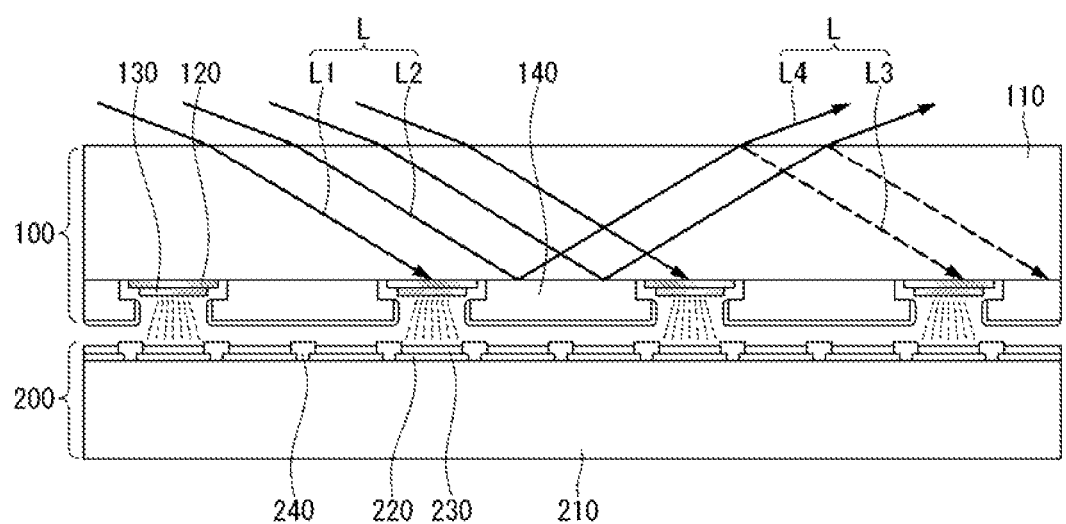
FIG. 2 is a cross-sectional view showing a part of FIG. 1 according to an embodiment of the present invention.
Figure 3:
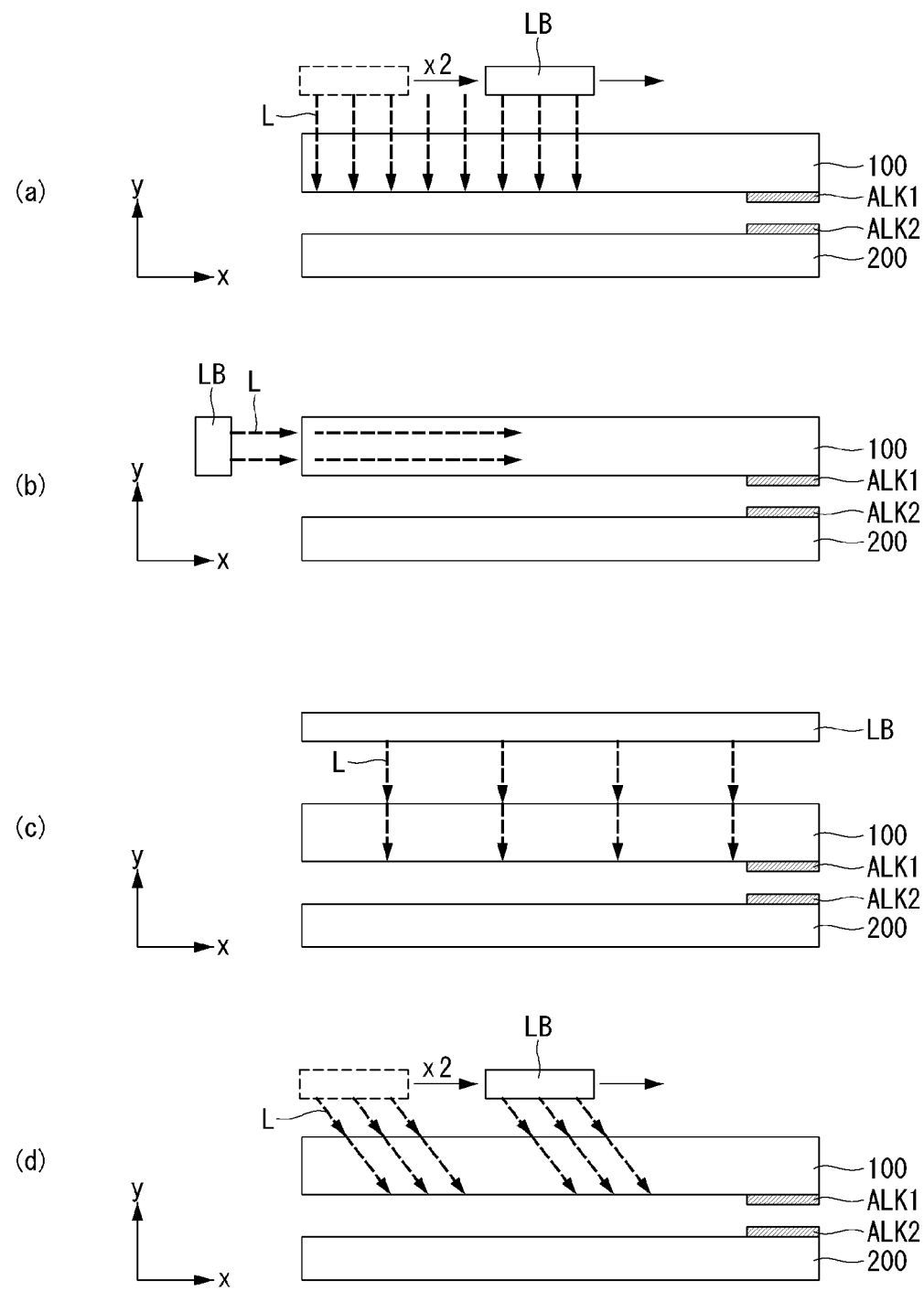
FIG. 3, including (a)-(d), shows diagrams illustrating laser radiating methods of the ultra-fine pattern deposition apparatus according to the first embodiment of the present invention.

FIG. 1 is a perspective view for schematically describing a pattern deposition method using an ultra-fine pattern deposition apparatus according to a first embodiment of the present invention, FIG. 2 is a cross-sectional view showing a part of FIG. 1, and FIG. 3 is a diagram illustrating describing a laser radiating method of the ultra-fine pattern deposition apparatus according to the first embodiment of the present invention.

As shown in FIGS. 1 and 2, the ultra-fine pattern deposition apparatus 100 according to the first embodiment of the present invention operates in response to laser beams L radiated from a laser radiating device LB. Although the ultra-fine pattern deposition apparatus 100 is arranged above a target substrate 200 in FIGS. 1 and 2, the ultra-fine pattern deposition apparatus 100 may be arranged under the target substrate 200.

When the ultra-fine pattern deposition apparatus 100 is disposed above the target substrate 200, the laser radiating device LB radiates laser beams L above the ultra-fine pattern deposition apparatus 100. When the ultra-fine pattern deposition apparatus 100 is disposed under the target substrate 200, the laser radiating device LB radiates the laser beams L under the ultra-fine pattern deposition apparatus 100.

The target substrate 200 includes at least a substrate 210, a lower electrode (or anode electrode) 220 and a bank layer 240. The ultra-fine pattern deposition apparatus 100 includes at least a base substrate 110, a photothermal converter 120 and a light reflector 140. The photothermal converter 120 absorbs laser beams L and the light reflector 140 reflects laser beams L and, simultaneously, guides a source only to a target region.

When laser is radiated to the ultra-fine pattern deposition apparatus 100, laser beams are absorbed, reflected or re-reflected. For example, first laser beams L1 may be absorbed through the photothermal converter 120 and second laser beams L2 may be reflected through the light reflector 140. Some of the second laser beams L2 may be re-reflected along with third laser beams L3 and absorbed through the photothermal converter 120 or reflected through the light reflector 140, or emitted to outside along with fourth laser beams L4.

An organic thin film 230 is formed on the exposed lower electrode 220 on the target substrate 200 based on a source emitted from a source part 130 according to photothermal conversion operation of the ultra-fine pattern deposition apparatus 100. When a process of forming an upper electrode (or cathode electrode) is finished, the organic thin film 230 becomes an organic emitting layer which emits light on the target substrate 200.

The ultra-fine pattern deposition apparatus 100 according to the first embodiment of the present invention deposits and transfers a pattern (or source) using total reflection of light in the base substrate 110 and may be defined as a patterning technique based on aperture based selective patterning (ASP). The patterning technique according to the first embodiment of the present invention can improve deposition accuracy and deposition efficiency.

As shown in FIG. 3, the ultra-fine pattern deposition apparatus 100 is arranged above the target substrate 200, and the ultra-fine pattern deposition apparatus 100 and the target substrate 200 are arranged and aligned based on alignment keys ALK1 and ALK2 positioned corresponding to each other. The ultra-fine pattern deposition apparatus 100 and the target substrate 200 may be arranged such that structures corresponding to the top layers thereof contact each other or almost contact each other, or they are separated from each other by a predetermined distance or longer.

Laser beams L may be radiated in at least one of upward, downward and lateral directions with respect to the base substrate 110. The laser radiating device LB may radiate the laser beams L at various angles at various positions. Examples of radiation of the laser beams L will be described below.

As shown in (a) of FIG. 3, the laser radiating device LB may radiate the laser beams L in a scanning manner while slightly moving in the horizontal direction X above the ultra-fine pattern deposition apparatus 100. The laser radiating device LB may radiate the laser beams L such that the laser beams L are input to the ultra-fine pattern deposition apparatus 100 having the straight propagation property in the vertical direction Y. In this instance, an organic source may also be given the straight propagation property and thus can be prevented from being spread to neighboring areas.

As shown in (b) of FIG. 3, the laser radiating device LB may radiate the laser beams L at the side of the ultra-fine pattern deposition apparatus 100 in a scanning manner or fixed manner. The laser radiating device LB may radiate the laser beams L such that the laser beams L are input to the ultra-fine pattern deposition apparatus 100 having the straight propagation property in the horizontal direction X. In addition, the ultra-fine pattern deposition apparatus 100 may cause the laser beams L input to the inside thereof to be absorbed, reflected or re-reflected.

As shown in (c) of FIG. 3, the laser radiating device LB may be located above the ultra-fine pattern deposition apparatus 100, having a size corresponding to the upper part of the ultra-fine pattern deposition apparatus 100, and radiate the laser beams L. The laser radiating device LB may radiate the laser beams L such that the laser beams L are input to the ultra-fine pattern deposition apparatus 100 having the straight propagation property in the vertical direction Y.

As shown in (d) of FIG. 3, the laser radiating device LB may radiate the laser beams L while continuously moving in the horizontal direction X above the ultra-fine pattern deposition apparatus 100. The laser radiating device LB may radiate the laser beams L such that the laser beams L are input to the ultra-fine pattern deposition apparatus 100 at a certain angle while having the straight propagation property in the vertical direction Y.

Figure 4:
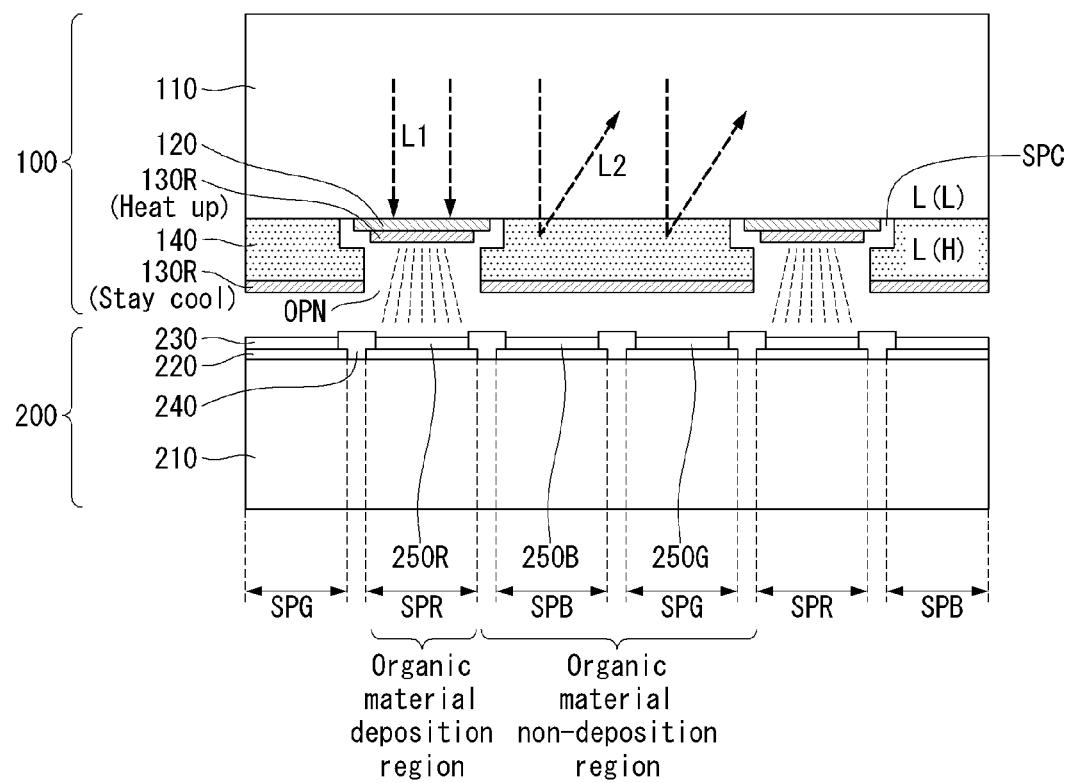
FIG. 4 is a cross-sectional view schematically illustrating the ultra-fine pattern deposition apparatus according to the first embodiment of the present invention.
Figure 5:
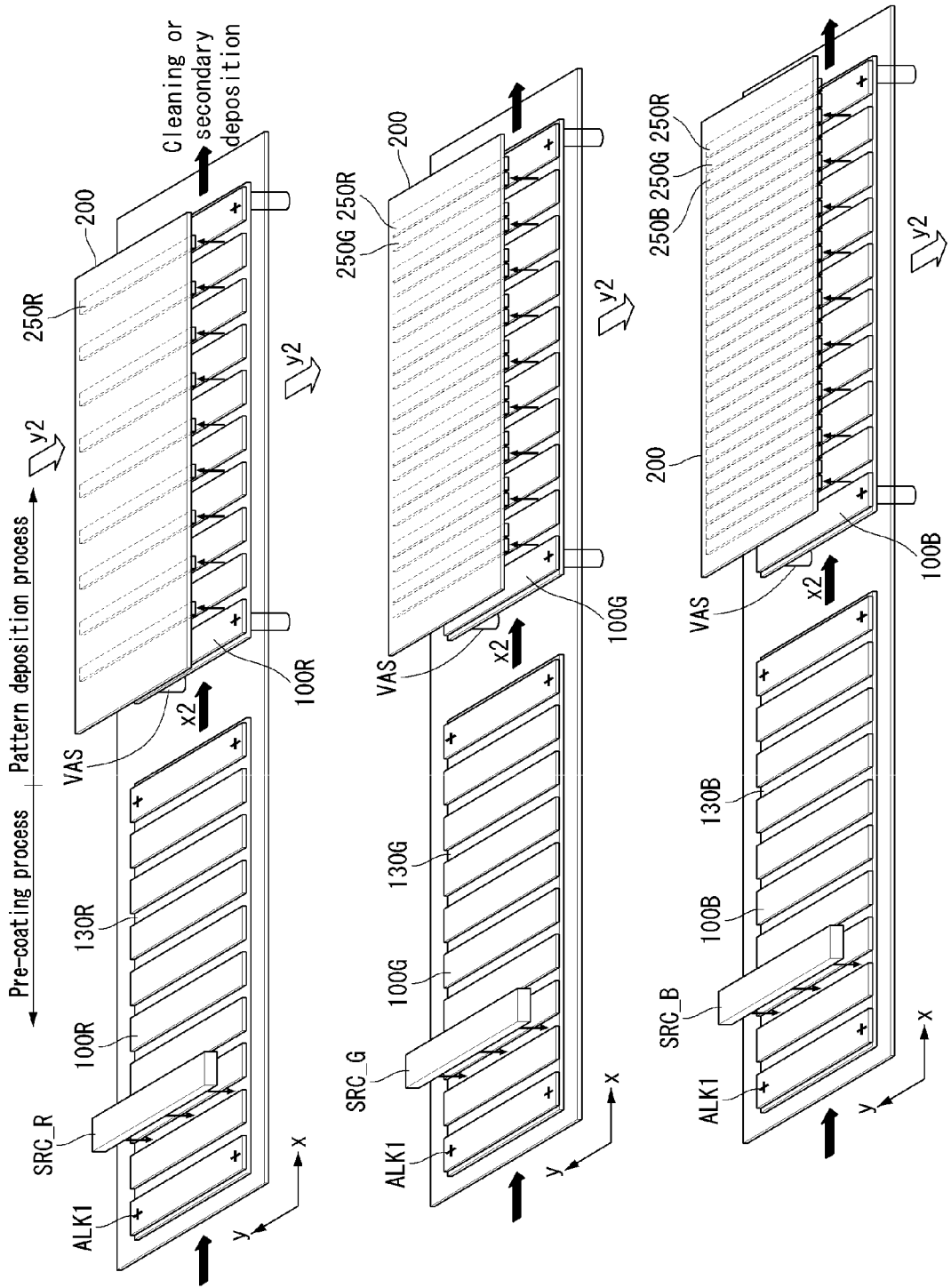
FIG. 5 is a diagram illustrating a process flow illustrating processes from pre-coating of a source to pattern deposition.

FIG. 4 is a cross-sectional view schematically illustrating the ultra-fine pattern deposition apparatus according to the first embodiment of the present invention, FIG. 5 is a diagram illustrating a process flow illustrating processes from pre-coating of a source to pattern deposition, and FIG. 6 is a diagram illustrating structures of the light reflector.

As shown in FIG. 4, the target substrate 200 includes at least the substrate 210, the lower electrode 220 and the bank layer 240. The ultra-fine pattern deposition apparatus 100 includes the base substrate 110, the photothermal converter 120, a source part 130R and the light reflector 140.

The substrate 210 may further include transistors. The lower electrode 220 is separated corresponding to sub-pixel regions SPR, SPG and SPB and arranged. The lower electrode 220 is connected to the source or drain electrode of a driving transistor included in the transistors. The bank layer 240 is arranged to isolate the lower electrode 220 into parts respectively corresponding to sub-pixels and to define emission regions. However, the bank layer 240 may be arranged in other forms or may be omitted depending on the structure of the target substrate.

The base substrate 110 serves as a base of the ultra-fine pattern deposition apparatus 100. A transparent material is selected for the base substrate 110. For example, the base substrate 110 may be made of a transparent material having high transparency (transmittance) or high light guide property, such as quartz or amorphous glass. However, the present invention is not limited thereto.

The photothermal converter 120 absorbs the first laser beams L1 and converts the energy of the absorbed first laser beams L1 into thermal energy to apply heat to the source part 130R. The photothermal converter 120 is disposed on one side of the base substrate 110. One side of the base substrate 110 is the opposite side of the other side of the base substrate 100 to which the first laser beams L1 are input. For example, the photothermal converter 120 may be formed of a material having high efficiency of conversion of laser beams into thermal energy, such as carbon black or metal nano-pattern (surface plasmon resonance (SPR)). However, the present invention is not limited thereto.

The photothermal converter 120 is disposed to correspond to some of the lower electrodes 220 of the target substrate 200. In a first example, when the ultra-fine pattern deposition apparatus 100 is configured to deposit an organic thin film 250R of red sub-pixels, the source part 130R corresponds to only emission regions of the red sub-pixel regions SPR. In a second example, when the ultra-fine pattern deposition apparatus 100 is configured to deposit an organic thin film 250G of green sub-pixels, the source part 130R corresponds to only emission regions of the green sub-pixel regions SPG. In a third example, when the ultra-fine pattern deposition apparatus 100 is configured to deposit an organic thin film 250B of blue sub-pixels, the source part 130R corresponds to only emission regions of the blue sub-pixel regions SPB.

The light reflector 140 reflects the second laser beams L2 to block the second laser beams L2 such that the second laser beams L2 do not pass therethrough. The light reflector 140 is disposed on one side of the base substrate 110. For example, the light reflector 140 is realized as a total internal reflection (TIR) interface.

The light reflector 140 is formed as a single layer and may be formed of a material having a refractive index different from the base substrate 110. For example, when the base substrate 110 has a high refractive index H (or a low refractive index L), the light reflector 140 is selected to have a low refractive index L (or a high refractive index H). In addition, the light reflector 140 may reflect external light by being formed of a material having a high-refractive-index medium or a material having a low-refractive-index medium, being formed in a structure in which these materials are repeatedly formed or being formed in a structure having a function similar to the above structure to produce a refractive index difference between the light reflector 140 and the base substrate 110.

The light reflector 140 guides a source emitted from the source part 130R only to target regions while preventing the source from arriving at regions other than the target regions. To achieve this, the light reflector 140 has openings OPN having a lower part and an upper part laterally projected from the lower part in order to guide the source emitted from the source part only to target regions. As a result, only the source part is exposed through the openings OPN when viewed from above the upper side of the base substrate. For reference, the lower parts of the openings OPN contact the base substrate and the upper parts thereof are exposed to outside. Accordingly, the light reflectors 140 may have a T-shape (or a mushroom shape). However, the shape of the light reflector 140 is not limited to that shown in the figure.

In addition, the width of the opening OPN corresponds to the width of the emission region of a sub-pixel arranged facing the opening OPN. For example, when a sub-pixel emitting light in a first color is disposed at the left, right or top of a sub-pixel emitting light in the same first color, the opening OPN has a width corresponding to the emission regions of the two sub-pixels. Further, the opening OPN may have different widths according to positions. For example, sub-pixels may have different emission region widths and thus the opening OPN may have different widths corresponding thereto.

A non-opening portion of the light reflector 140 may be defined as a region through which the source is not emitted, that is, a region in which an organic material is not deposited (e.g., organic material non-deposition regions), and the openings OPN corresponding to the source part 130R may be defined as regions through which the source is emitted, that is, organic material deposition regions. The openings OPN of the light reflector 140 and the source part 130R may have identical or similar sizes and shapes. Accordingly, the openings OPN of the light reflector 140 and the source part 130R may be formed in a triangular, a rectangular, a square, a circular, an oval, a diamond or polygonal shape. However, the present invention is not limited thereto.

A source which evaporates in response to heat applied by the photothermal converters 120 is selected for the source part 130R. For example, the source of the source part 130R may be based on an organic layer flux bidirectionally separated instead of Lambertian.

For example, while an organic source or an inorganic source may be selected for the source part 130R, the organic source and the inorganic source will be collectively called a source in the following description. The source part 130R is formed on the photothermal converter 120 and the light reflector 140, that is, on the overall surface of the base substrate 100 in the example shown in FIG. 4. However, this is an example and the source part 130R may be disposed on only photothermal converter 120 corresponding to the openings OPN of the light reflector 140.

The source part 130R disposed on the photothermal converter 120 heats up and thus evaporates. Accordingly, an organic thin film is deposited on lower electrodes 220 of the target substrate 200, which correspond to organic material deposition regions. The source part 130R disposed on the light reflector 140 stays cool and thus does not evaporate. Accordingly, an organic thin film is not deposited on lower electrodes 220 of the target substrate 200, which correspond to organic material non-deposition regions.

The ultra-fine pattern deposition apparatus 100 for depositing a red organic source has been described in the above example. The ultra-fine pattern deposition apparatus 100 may be classified into an apparatus for depositing a red organic source, an apparatus for depositing a green organic source and an apparatus for depositing a blue organic source. In this instance, sources may be pre-coated by colors thereof and then pattern deposition may be performed. This will be described below.

As shown in FIG. 5, ultra-fine pattern deposition apparatuses 100R, 100G and 100B for depositing red, green and blue organic sources are separately arranged on a transfer means such as a conveyor belt in order to pre-coat the sources according to the colors thereof.

The transfer means transfers the ultra-fine pattern deposition apparatuses 100R, 100G and 100B for depositing the red, green and blue organic sources in the X-axis direction. For example, the red, green and blue organic sources SRC_R, SRC_G and SRC_B are filled in all openings of the ultra-fine pattern deposition apparatuses 100R, 100G and 100B while the ultra-fine pattern deposition apparatuses 100R, 100G and 100B for depositing the red, green and blue organic sources are transferred by the transfer means in an x2 direction.

The purpose of the ultra-fine pattern deposition apparatus is defined by a source pre-coating process. Although the ultra-fine pattern deposition apparatus 100 is the ultra-fine pattern deposition apparatus 100R for depositing a red organic source when the red organic source SRC_R is coated, as described above, the ultra-fine pattern deposition apparatus 100 is the ultra-fine pattern deposition apparatus 100G for depositing a green organic source when the green organic source SRC_G is coated and the ultra-fine pattern deposition apparatus 100B for depositing a blue organic source when the blue organic source SRC_B is coated.

Thereafter, the ultra-fine pattern deposition apparatus 100R for depositing the red organic source and the target substrate 200 are arranged and aligned based on alignment keys (ALK1 and ALK2) provided thereto and a vision system VAS. Then, laser beams for ultra-fine pattern deposition are radiated to the ultra-fine pattern deposition apparatus 100R for depositing the red organic source, and a pattern deposition process through which the source evaporates according to heat generation of the photothermal converter is performed. The source deposited in red sub-pixel regions of the target substrate 200 through the deposition process becomes an organic thin film for emitting red light.

Subsequently, the target substrate 200 is moved in a y2 direction in the Y-axis direction and then arranged and aligned with the ultra-fine pattern deposition apparatus 100G for depositing the green organic source. Thereafter, laser beams for ultra-fine pattern deposition are radiated to the ultra-fine pattern deposition apparatus 100G for depositing the green organic source and a pattern deposition process through which the source evaporates according to heat generation of the photothermal converter is performed. The source deposited in green sub-pixel regions of the target substrate 200 through the deposition process becomes an organic thin film for emitting green light.

Subsequently, the target substrate 200 is moved in the y2 direction in the Y-axis direction and then arranged and aligned with the ultra-fine pattern deposition apparatus 100B for depositing the blue organic source. Thereafter, laser beams for ultra-fine pattern deposition are radiated to the ultra-fine pattern deposition apparatus 100B for depositing the blue organic source and a pattern deposition process through which the source evaporates according to heat generation of the photothermal converter is performed. The source deposited in blue sub-pixel regions of the target substrate 200 through the deposition process becomes an organic thin film for emitting blue light.

Thus, the pattern deposition processes for depositing the red, green and blue organic thin films can be sequentially performed while the target substrate 200 is moved in the y2 direction although the ultra-fine pattern deposition apparatuses 100R, 100G and 100B for depositing the red, green and blue organic sources are moved in the x2 direction.

However, the apparatuses for performing the pattern deposition processes and the substrate movement directions are examples and the present invention is not limited thereto. Additionally, a cleaning process for removing residual organic sources or a pre-coating process for secondary deposition may be performed on the ultra-fine pattern deposition apparatuses after completion of the pattern deposition processes.

As shown in (a) of FIG. 6, the light reflector 140 may be formed of at least two layers corresponding to a lower structure 141 and an upper structure 142 instead of being formed of a single layer. The lower structure 141 is disposed on one side of the base substrate 110 and supports the upper structure 142. The upper structure 142 is positioned on the lower structure 141 and guides the source emitted from the source part 130 to a target region of the target substrate.

A guide part defines the opening OPN which exposes the source part 130. To achieve this, the upper structure 142 is projected in the lateral direction such that the area of the upper structure 142 is larger than the lower structure 141 in both the plan view and the cross-sectional view of the base substrate 110 (e.g., the upper structure 142 sticks our farther than the lower structure 141, thus forming a type of funnel for guiding the evaporated source material). The lower structure 141 and the upper structure 142 may be formed of the same material or different materials.

The lower structure 141 and the upper structure 142 may be formed of a material which can be etched using an etching solution. When the lower structure 141 and the upper structure 142 are formed, undercut processing using an etching solution may be used such that the lower structure 141 is laterally recessed from the upper structure 142. When the undercut processing is used, the lower part of the opening OPN in contact with the base substrate 110 is wider than the upper part thereof separated from the base substrate 110. Accordingly, the light reflector 140 has an undercut structure formed through the undercut processing (e.g., the light reflector 140 can have a reverse tapered shape relative to the base substrate 110 or a side of the light reflector and a surface of the base substrate 110 can form an acute angle).

Furthermore, when the undercut processing is used, part of the lower structure 141 is removed and thus a space SPC can be formed under the upper structure 142. Accordingly, the light reflector 140 may have a T-shape (or mushroom shape). However, the shape of the light reflector 140 is not limited to that shown in the figure.

As shown in (b) of FIG. 6, the light reflector 140 may be formed of a single layer. In this instance, the light reflector 140 may also be formed of a material which can be etched using an etching solution. To form an opening OPN which becomes wider with decreasing distance to the base substrate 110, undercut processing using an etching solution may be used. Accordingly, the opening OPN of the light reflector 140 may have a reverse tapered shape (e.g., relative to the outermost portion of the opening that faces toward the target, in order to for a type of funnel). However, the shape of the opening OPN is not limited to that shown in the figure.

As shown in FIG. 6, the space SPC which is not exposed to outside is provided inside the opening OPN of the light reflector 140. The space SPC is formed between the laterally recessed lower part of the opening OPN and the surface of the base substrate 110. The sidewall and the ceiling forming the space SPC may have a straight, non-straight, diagonal, circular, oval or polygonal shape depending on characteristics of the material and an etch rate.

In addition, the space SPC provided between the opening OPN of the light reflector 140 and the base substrate 110 serves to store heat generated from the photothermal converter and to provide the stored heat to the source part 130 in order to aid in evaporation of the source part 130. Further, the space SPC provided between the opening OPN of the light reflector 140 and the base substrate 110 serves to prevent the source evaporated from the source part 130 from reaching regions other than the opening OPN. Accordingly, the shape of the space SPC provided between the opening OPN of the light reflector 140 and the base substrate 110 can be optimized through repeated experiment in consideration of the aforementioned characteristics.

Second Embodiment

Figure 7:
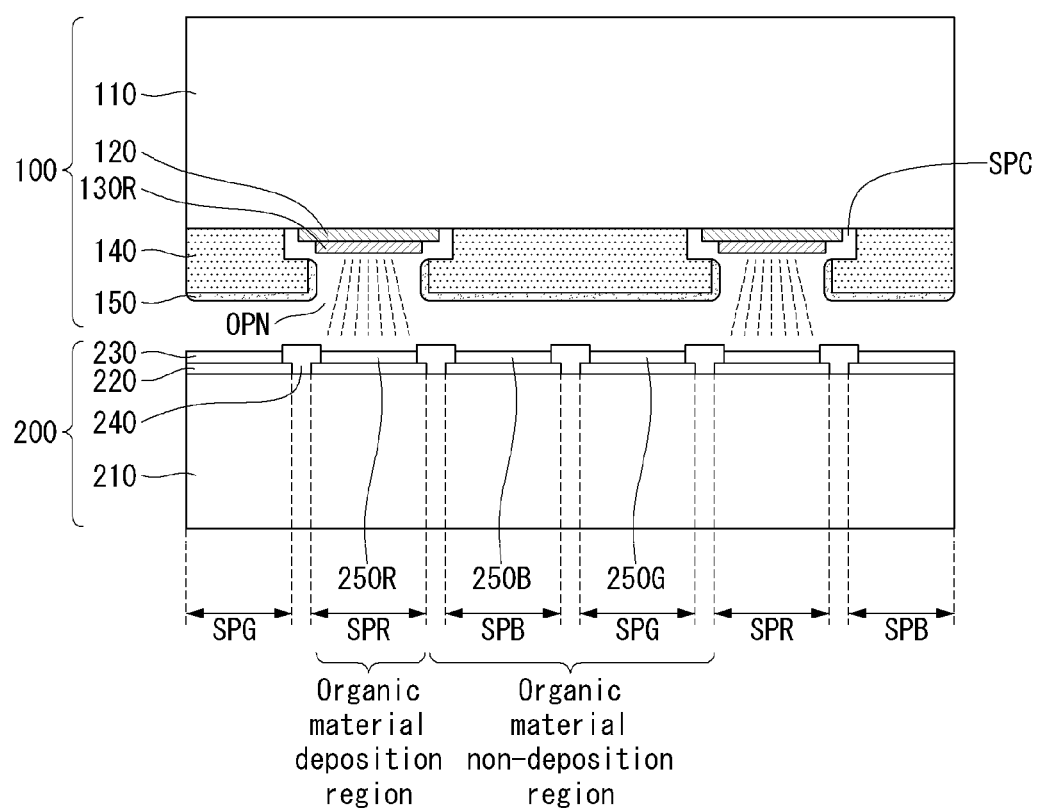
FIG. 7 is a diagram showing an ultra-fine pattern deposition apparatus according to a second embodiment of the present invention.

FIG. 7 is a diagram illustrating an ultra-fine pattern deposition apparatus according to a second embodiment of the present invention.

As shown in FIG. 7, the configuration of the ultra-fine pattern deposition apparatus 100 according to the second embodiment of the present invention is similar to that of the ultra-fine pattern deposition apparatus according to the first embodiment, but the second embodiment differs from the first embodiment in that a coating layer 150 is additionally formed on the light reflector 140.

The coating layer 150 serves to prevent the source from being coated on the light reflector 140 during the source pre-coating process or to aid in simultaneous removal of the coating layer 150 and the source coated thereon through a simple cleaning process. The coating layer 150 may be formed to cover the surface and side of the light reflector 140.

The structure in which the coating layer 150 is formed on the light reflector 140 does not require a selective coating process for depositing a source in a specific color in the opening OPN of the light reflector 140.

That is, when the coating layer 150 is present, source pre-coating can be performed from the front of the ultra-fine pattern deposition apparatus 100. In addition, when the coating layer 150 is present, a problem caused by a source remaining in the region (on the surface of the light reflector) other than the opening OPN of the light reflector 140 can be solved (because residue generated in the selective coating process can be removed).

Third Embodiment

Figure 8:
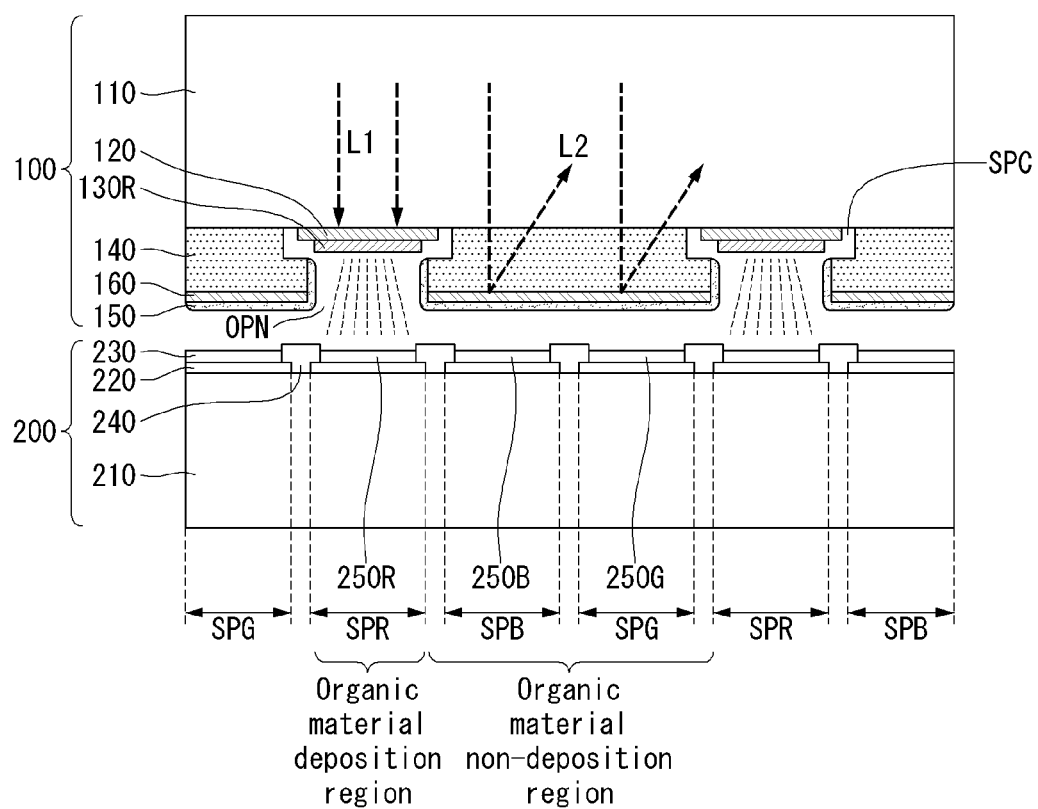
FIG. 8 is a diagram showing an ultra-fine pattern deposition apparatus according to a third embodiment of the present invention.

FIG. 8 is a diagram illustrating an ultra-fine pattern deposition apparatus according to a third embodiment of the present invention.

As shown in FIG. 8, the configuration of the ultra-fine pattern deposition apparatus 100 according to the third embodiment of the present invention is similar to that of the ultra-fine pattern deposition apparatus according to the first embodiment, but the third embodiment differs from the first embodiment in that the light reflector 140 further includes a reflective metal layer 160. The reflective metal layer 160 serves to complement the reflection function of the light reflector 140.

The reflective metal layer 160 blocks and reflects light that might pass through the light reflector 140 in spite of the reflection ability of the light reflector 140. The reflective metal layer 160 may be formed having a size corresponding to the upper part of the light reflector 140 or formed to cover the overall surface of the light reflector 140.

Further, since the light reflector 140 may be formed in a multi-layer structure, the reflective metal layer 160 may be formed inside of the light reflector 140, that is, between layers forming the light reflector 140. In this instance, the reflective metal layer 160 may be formed of a single layer or multiple layers. The reflective metal layer 160 may be formed of a metal material such as Ag or Al, but the present invention is not limited thereto.

Fourth Embodiment

Figure 9:
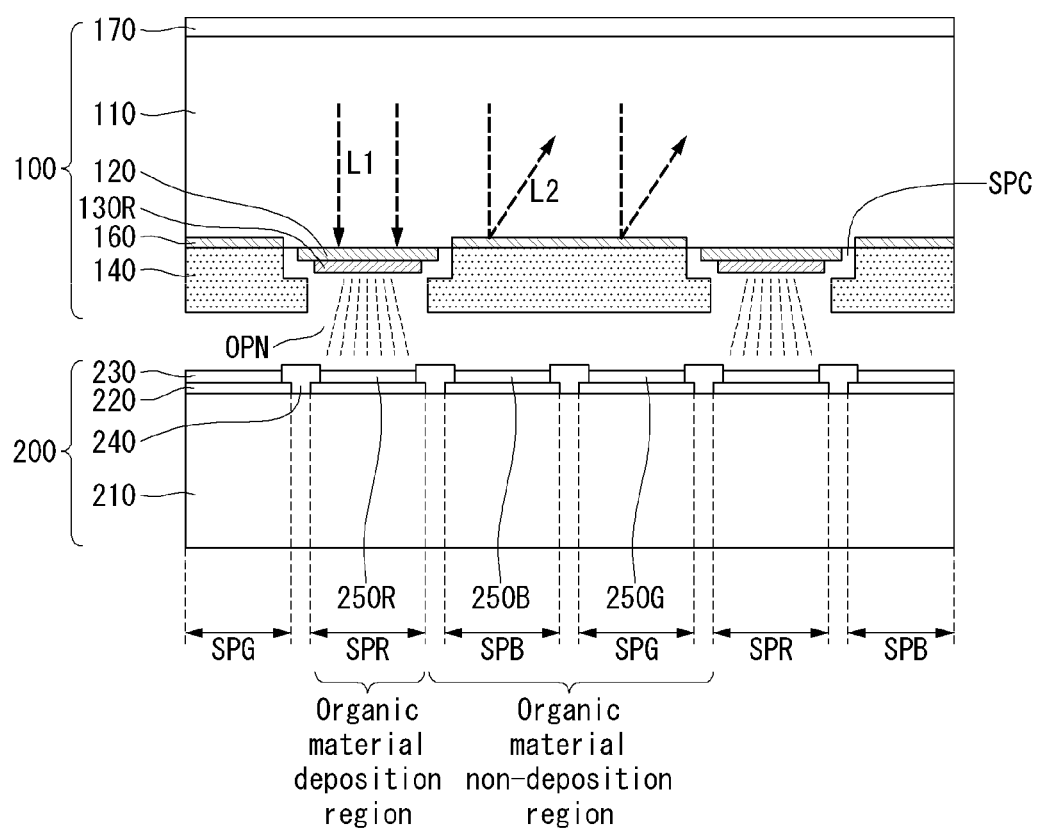
FIG. 9 is a diagram showing an ultra-fine pattern deposition apparatus according to a fourth embodiment of the present invention.

FIG. 9 is a diagram illustrating an ultra-fine pattern deposition apparatus according to a fourth embodiment of the present invention.

As shown in FIG. 9, the configuration of the ultra-fine pattern deposition apparatus 100 according to the fourth embodiment of the present invention is similar to that of the ultra-fine pattern deposition apparatus according to the first embodiment, but the fourth embodiment differs from the first embodiment in that the light reflector 140 further includes the reflective metal layer 160 and an anti-reflective layer 170 is additionally formed on the other side (laser beam incident surface) of the base substrate 110. The anti-reflective layer 170 corresponds to a light coupling enhancement layer. The reflective metal layer 160 may be omitted.

The reflective metal layer 160 blocks and reflects light that passes the light reflector 140 in spite of the reflection ability of the light reflector 140. The reflective metal layer 160 may be positioned under the light reflector 140 and buried in a recess formed in the base substrate 110.

The surface of the reflective metal layer 160 may be level with the surface of the base substrate 110 (e.g., outer portions of the base substrate and the reflective metal layer can provide a flush surface). Although the reflective metal layer 160 may be formed having a size corresponding to the lower part of the light reflector 140, the present invention is not limited thereto. The reflective metal layer 160 may be formed of a single layer or multiple layers.

The anti-reflective layer 170 serves to reduce loss of light by allowing laser beams to be input into the base substrate 110 without being reflected. The anti-reflective layer 170 may be formed on the other side of the base substrate 110 by being coated thereon or formed as a film and attached to the other side of the base substrate 110.

Fifth Embodiment

Figure 10:
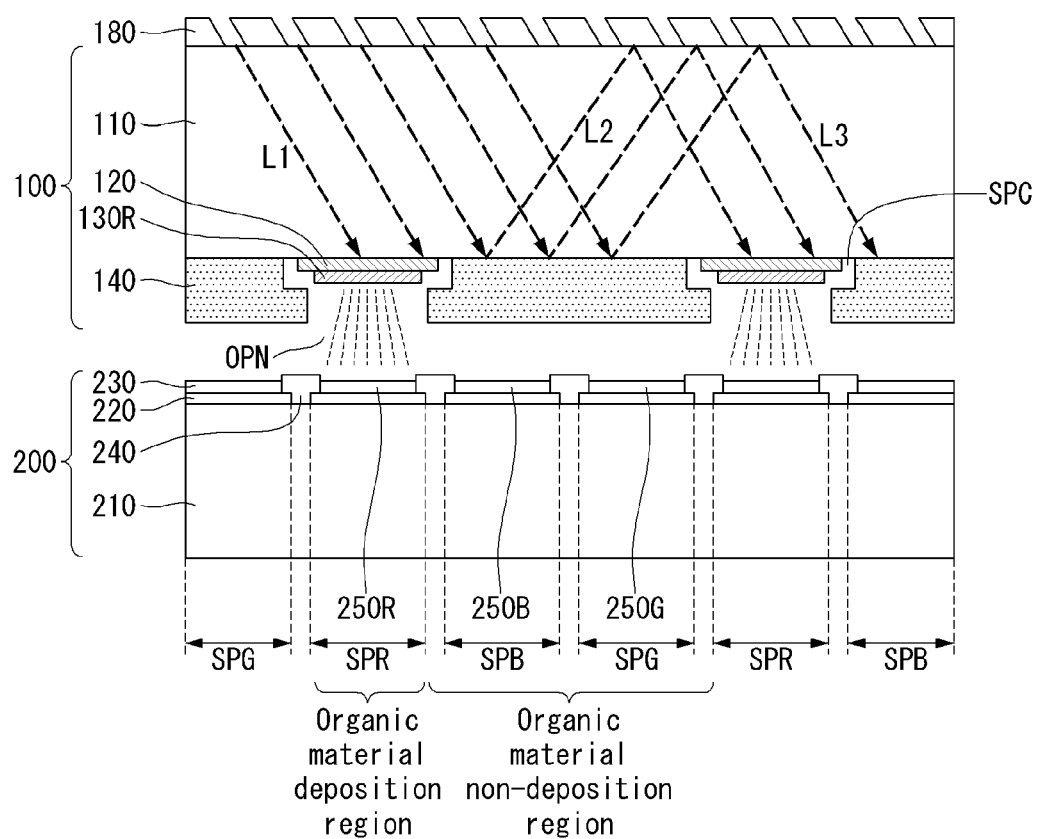
FIGS. 10 and 11 are diagrams showing an ultra-fine pattern deposition apparatus according to a fifth embodiment of the present invention.
Figure 11:
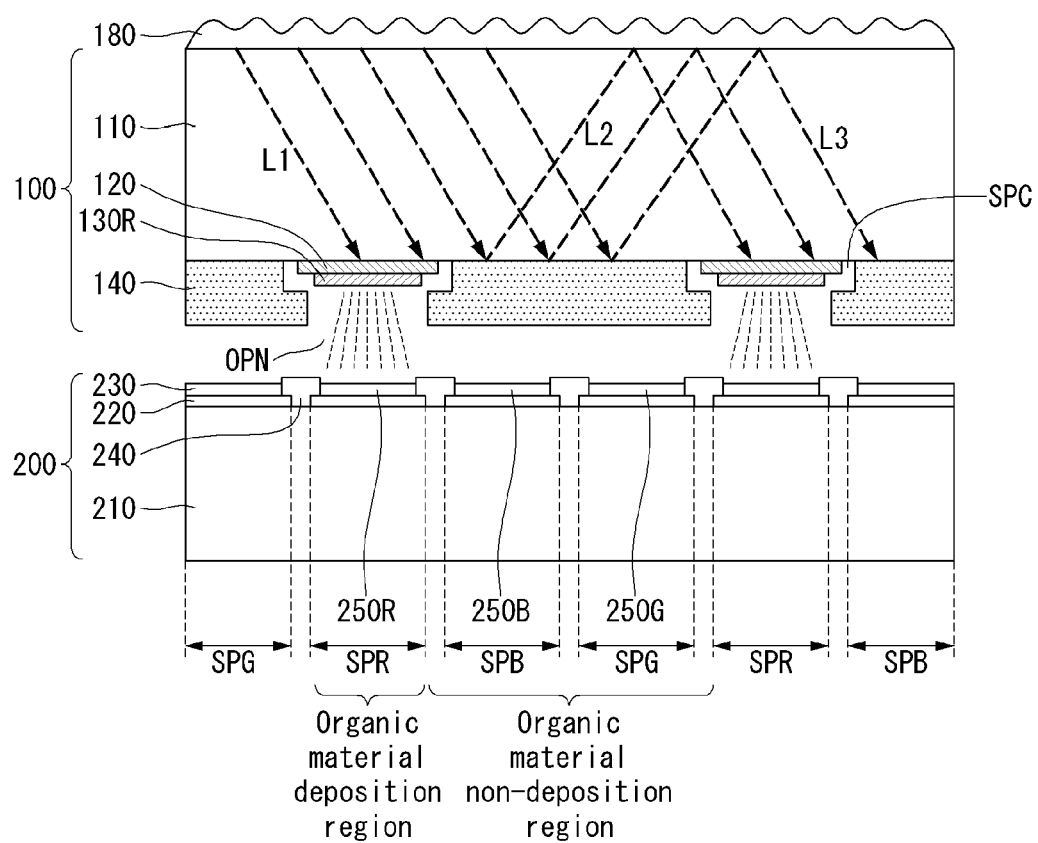

FIGS. 10 and 11 are diagrams illustrating an ultra-fine pattern deposition apparatus according to a fifth embodiment of the present invention.

As shown in FIG. 10, the configuration of the ultra-fine pattern deposition apparatus 100 according to the fifth embodiment of the present invention is similar to that of the ultra-fine pattern deposition apparatus according to the first embodiment, but the fifth embodiment differs from the first embodiment in that a grating layer 180 is additionally formed on the other side of the base substrate 110. The grating layer 180 corresponds to a light coupling enhancement layer.

The grating layer 180 serves to facilitate input of laser beams into the base substrate 110. To achieve this, the grating layer 180 may be formed in a pattern having an optical path at a specific angle, as shown in FIG. 10, formed in a wave pattern, as shown in FIG. 11, or formed of multiple layers having different refractive indexes (different media). It is desirable that the patterns as shown in FIGS. 10 and 11 have a gradient corresponding to a light incident angle.

When the grating layer 180 is used, the first laser beams L1 arriving at the photothermal converter 120 are absorbed and the second laser beams L2 arriving at the light reflector 140 are reflected (first reflection). Then, the reflected second laser beams L2 are reflected by the grating layer 80 (second reflection) instead of being radiated to outside because the grating layer 180 can pass only laser beams input at a specific angle.

For example, the third laser beams L3 reflected by the grating layer 180 arrive at the neighboring photothermal converter 120 to be absorbed or reflected again (third reflection). When the grating layer 180 is used, laser beams are repeatedly reflected inside of the base substrate 110 and thus improvement of reusability of laser beams and laser beam efficiency can be expected.

Sixth Embodiment

Figure 12:
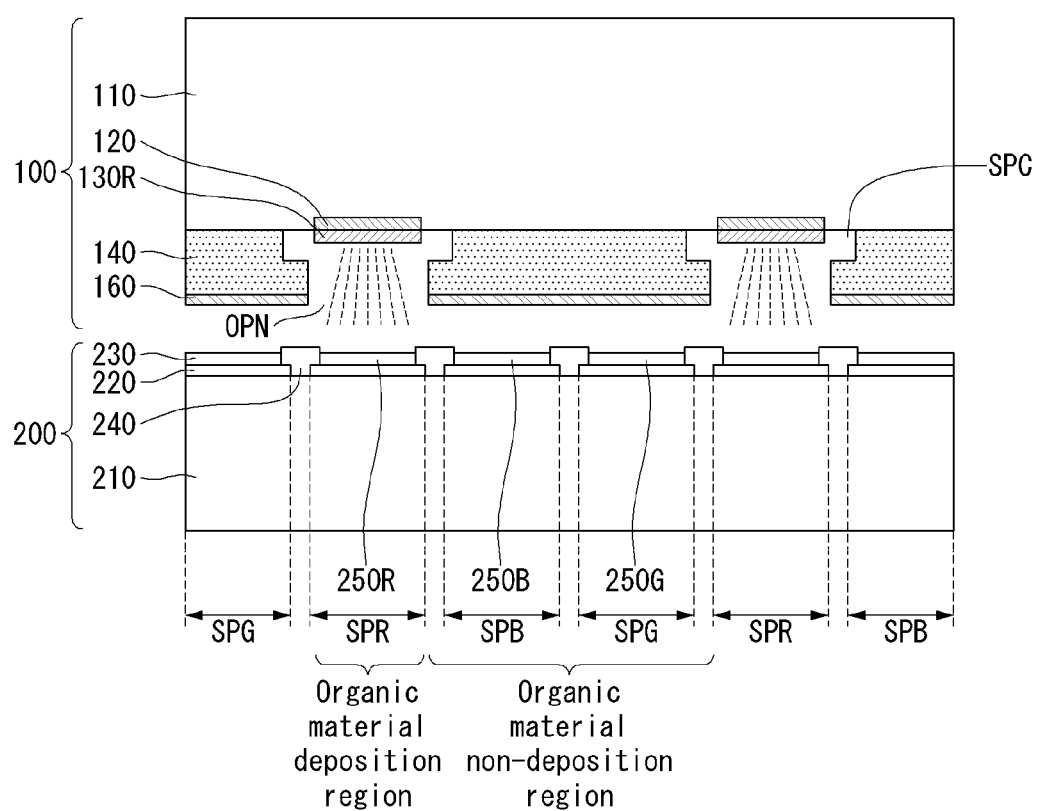
FIG. 12 is a diagram showing an ultra-fine pattern deposition apparatus according to a sixth embodiment of the present invention.

FIG. 12 is a diagram illustrating an ultra-fine pattern deposition apparatus according to a sixth embodiment of the present invention.

As shown in FIG. 12, the configuration of the ultra-fine pattern deposition apparatus 100 according to the sixth embodiment of the present invention is similar to that of the ultra-fine pattern deposition apparatus according to the first embodiment, but the sixth embodiment differs from the first embodiment in that the photothermal converter 120 is buried in a recess formed in the base substrate 110 and the light reflector 140 further includes the reflective metal layer 160. The reflective metal layer 160 may be omitted.

The surface of the photothermal converter 120 may level with the surface of the base substrate 110 (e.g., outer portions of the photothermal converter and the base substrate can provide a flush surface). Alternatively, the surface of the photothermal converter 120 may be higher or lower than the surface of the base substrate 110 or the photothermal converter 120 may be completely buried inside of the base substrate 110 (e.g., the photothermal converter can be fully enveloped by the base substrate).

That is, the photothermal converter 120 may be formed so the surface thereof is protruded from the surface of the base substrate 110 or recessed from the surface of the base substrate 110, or the photothermal converter 120 is completed buried in the base substrate 110 such that the surface thereof is not exposed. When the photothermal converter 120 is completed buried inside of the base substrate 110, it is advantageous to protect the photothermal converter 120 from being damaged (when the photothermal converter is formed of a metal material) when the apparatus is cleaned or used for a long time. When the photothermal converter 120 is partially buried inside of the base substrate 110, as described above, laser beams input from the side of the base substrate 110 as well as the other side of the base substrate 110 can be easily converted into thermal energy.

Seventh Embodiment

Figure 13:
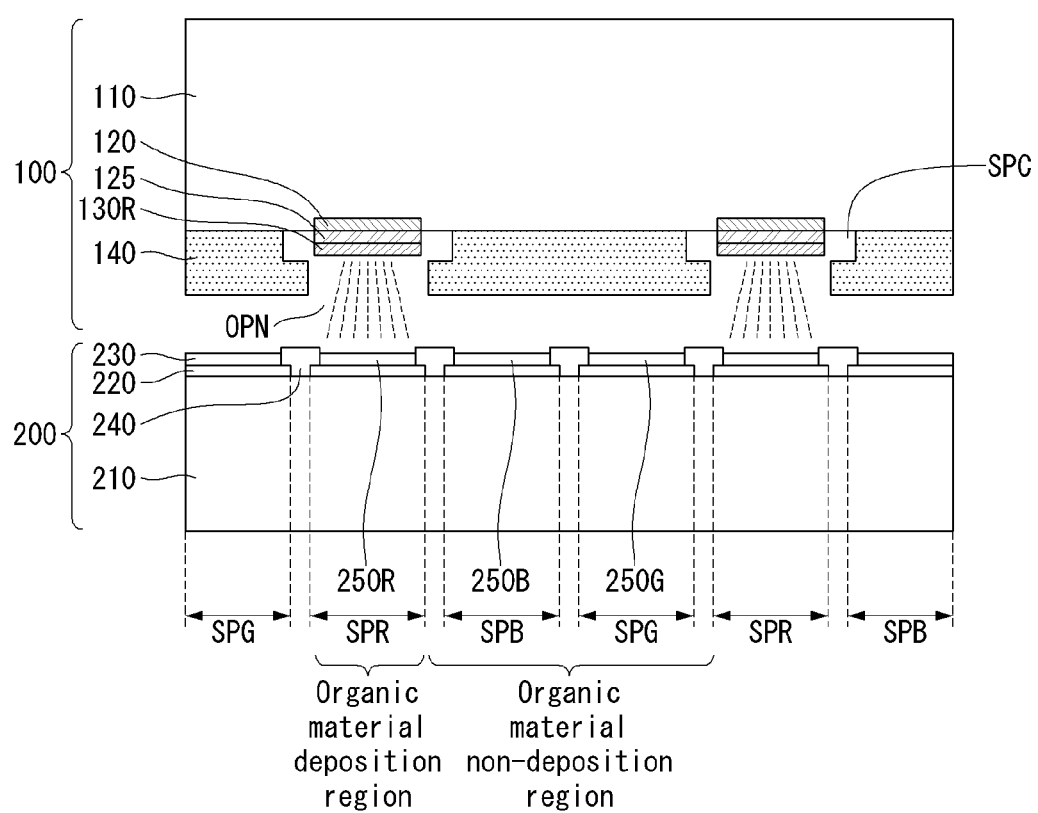
FIG. 13 is a diagram showing an ultra-fine pattern deposition apparatus according to a seventh embodiment of the present invention.

FIG. 13 is a diagram illustrating an ultra-fine pattern deposition apparatus according to a seventh embodiment of the present invention.

As shown in FIG. 13, the configuration of the ultra-fine pattern deposition apparatus 100 according to the seventh embodiment of the present invention is similar to that of the ultra-fine pattern deposition apparatus according to the first embodiment, but the seventh embodiment differs from the first embodiment in that the photothermal converter 120 is buried in a recess formed in the base substrate 110 and a functional layer 125 is additionally formed on the photothermal converter 120.

The functional layer 125 is formed between the photothermal converter 120 and the source part 130R. The functional layer 125 may be realized to serve as a heat conductor for increasing thermal conductivity such that heat generated from the photothermal converter 120 to be efficiently transferred to the source part 130R, to serve as a light blocker for blocking unnecessary light or serve as both the heat conductor and the light blocker. Thus, the functional layer 125 may be formed of a metal material such as Ag or Al, but the present invention is not limited thereto.

As described above, the embodiments of the present invention perform a deposition process using the ultra-fine pattern deposition apparatus which emits sources in a space thereunder and thus can emit and deposit sources in a stabilized state. In addition, emitted sources are deposited on only selected sub-pixel regions on the target substrate through the light reflector having a guide function.

Although the present invention has been described through various embodiments in order to clarify the components of the present invention, one or more of the components in the embodiments can be combined and thus two or more of the embodiments may be combined.

According to the above description, the embodiments of present invention have the following advantages.

1. Realization of Ultra-Fine (Ultra-Fine Pitch) High-Luminance/High-Efficiency Display Device.

An ultra-fine RGB OLED type or RGBW OLED type display device can be realized, and thus optical efficiency and luminance can be improved, compared to conventional W OLED type and color filter type display devices. This will be described in detail below.

1) Ultra-fine (ultra-fine pitch) display devices having 3,000 ppi or more, used for augmented reality (AR), can be realized using a silicon wafer based OLED (OLEDoS) formed using an RGB organic emission pattern.

2) Fine (fine pitch) 1,500 ppi display devices used for virtual reality (VR) can be realized using an OLED formed using an RGB organic emission pattern.

3) UHD display devices for smartphones can be realized using a plastic based OLED (pOLED).

2. Simplification of Pixel Structure of Ultra-Fine (Ultra-Fine Pitch) Display Device/Simplification of Manufacturing Process 1) A structure for removing lateral leakage current, such as a trench structure, can be eliminated, and thus a pixel structure and a display panel manufacturing process can be simplified.

Lateral leakage current is generated between pixels in tandem W OLED ultra-fine (ultra-fine pitch) display devices having 1,500 ppi or more. The lateral leakage current is generated through a charge generated layer (CGL) in most situations.

2) Since a hole transport layer (HTL) having different thicknesses for RGB pixels can be formed using an organic thin film pattern, a conventional complicated additional process for forming an anode having various thicknesses need not be used.

3. Realization of large-size RGB OLED type display device.

Since a substrate-based deposition source array can be used, mask sagging due to gravity, which is a fundamental issue of fine metal masking, can be solved and thus large-size RGB OLED type display devices can be realized. In addition, limitations in the conventional LITI and LIPS patterning methods can be overcome and ultra-fine pattern deposition accuracy and deposition efficiency can be enhanced.

Therefore, the present invention can overcome limitations in the conventional LITI and LIPS patterning methods and improve the accuracy and efficiency of ultra-fine pattern deposition. Furthermore, the present invention can solve a problem with respect to an increase in a pattern dimension allowance due to mask shadowing, a problem with respect to accuracy reduction due to sagging of the center of a mask, and the like. In addition, the present invention can provide a manufacturing method which can easily manufacture a large-size display panel. Moreover, the present invention can enhance thermal conductivity and protect components from being damaged when the apparatus is used for a long time, improving the life of the apparatus.

What is claimed is:

1. An ultra-fine pattern deposition apparatus comprising:
a base substrate;
a photothermal converter disposed on or in the base substrate and configured to convert optical energy into thermal energy;
a source part disposed on the photothermal converter;
a light reflector configured to:
reflect light based on a refractive index difference between the light reflector and the base substrate, and
guide a source material emitted from the source part to a target region based on an opening in the light reflector and the photothermal converter being heated with the thermal energy from the photothermal converter; and
a coating layer formed on the light reflector,
wherein the opening in the light reflector includes a laterally recessed lower part and an upper part protruded from the laterally recessed lower part, and the laterally recessed lower part is between the upper part and the base substrate,
wherein the photothermal converter is disposed between base substrate and the source part,
wherein the coating layer is disposed to cover the upper part of the light reflector and side parts of the light reflector to prevent the source material from being applied on the light reflector, and
wherein the coating layer is not formed on the laterally recessed lower part of the light reflector so that the laterally recessed lower part of the light reflector is exposed.

2. The ultra-fine pattern deposition apparatus according to claim 1, wherein the light reflector is formed of at least two layers on the base substrate.

3. The ultra-fine pattern deposition apparatus according to claim 1, wherein the refractive index of the light reflector is different from the refractive index of the base substrate.

4. The ultra-fine pattern deposition apparatus according to claim 1, wherein the opening further includes an empty space between the laterally recessed lower part and an outer surface of the base substrate, and the empty space is configured to trap heat from the thermal energy, and
wherein a sidewall and a ceiling forming the empty space have a straight shape, a non-straight shape, a diagonal shape, a circular shape, an oval shape or a polygonal shape.

5. The ultra-fine pattern deposition apparatus according to claim 1, wherein the opening in the light reflector has a tapered shape with respect to the base substrate or a funnel shape with respect to the base substrate.

6. The ultra-fine pattern deposition apparatus according to claim 1, wherein the light reflector includes a plurality of openings, and
wherein the light reflector further includes a portion disposed between two adjacent openings among the plurality of openings, and the portion has a reverse tapered shape with respect to the base substrate.

7. The ultra-fine pattern deposition apparatus according to claim 1, wherein the opening in the light reflector has an anvil shaped cross section.

8. The ultra-fine pattern deposition apparatus according to claim 1, wherein the photothermal converter is fully enveloped within the base substrate.

9. The ultra-fine pattern deposition apparatus according to claim 1, wherein the base substrate is transparent and the photothermal converter is black.

* * * * *